(12) United States Patent
Miki et al.

(10) Patent No.: US 11,664,406 B2
(45) Date of Patent: *May 30, 2023

(54) LIGHT-EMITTING DEVICE

(71) Applicant: NICHIA CORPORATION, Anan (JP)

(72) Inventors: Takuya Miki, Tokushima (JP); Naoki Matsuda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 79 days.

This patent is subject to a terminal disclaimer.

(21) Appl. No.: 17/302,008

(22) Filed: Apr. 21, 2021

(65) Prior Publication Data
US 2021/0242275 A1    Aug. 5, 2021

Related U.S. Application Data

(63) Continuation of application No. 16/222,571, filed on Dec. 17, 2018, now Pat. No. 11,024,667.

(30) Foreign Application Priority Data

Dec. 22, 2017  (JP) .............................. JP2017-245665
Apr. 12, 2018  (JP) .............................. JP2018-076518

(51) Int. Cl.
| | |
|---|---|
| *H01L 27/15* | (2006.01) |
| *H01L 33/50* | (2010.01) |
| *H01L 33/48* | (2010.01) |
| *F21Y 115/10* | (2016.01) |
| *H01L 33/20* | (2010.01) |

(Continued)

(52) U.S. Cl.
CPC .......... *H01L 27/15* (2013.01); *H01L 25/0753* (2013.01); *H01L 33/483* (2013.01); *H01L 33/50* (2013.01); *H01L 33/62* (2013.01); *F21V 5/04* (2013.01); *F21Y 2115/10* (2016.08); *H01L 33/20* (2013.01)

(58) Field of Classification Search
None
See application file for complete search history.

(56) References Cited

U.S. PATENT DOCUMENTS

| | | | |
|---|---|---|---|
| 9,970,628 B2 | 5/2018 | Zhang | |
| 11,024,667 B2* | 6/2021 | Miki | ................... H01L 25/0753 |

(Continued)

FOREIGN PATENT DOCUMENTS

| | | |
|---|---|---|
| JP | 2007507910 A | 3/2007 |
| JP | 2007158296 A | 6/2007 |

(Continued)

*Primary Examiner* — Telly D Green
(74) *Attorney, Agent, or Firm* — Hunton Andrews Kurth LLP

(57) ABSTRACT

A light-emitting device includes an inner light-emitting element having an n-sided polygonal shape (n is an integer of 3 or more) in a plan view with a peak emission wavelength in a range of 490 nm to 570 nm; m (m is an integer of 3 or more) outer light-emitting elements with a peak emission wavelength of 430 nm or greater and less than 490 nm; and a first phosphor with a peak emission wavelength in a range of 580 nm to 680 nm covering the inner light-emitting element and the m outer light-emitting elements. Each of n lateral surfaces of the inner light-emitting element faces a corresponding one of the m outer light-emitting elements in a top view.

20 Claims, 12 Drawing Sheets

(51) Int. Cl.
*H01L 33/62* (2010.01)
*H01L 25/075* (2006.01)
*F21V 5/04* (2006.01)

(56) References Cited

U.S. PATENT DOCUMENTS

| | | |
|---|---|---|
| 2007/0001188 A1 | 1/2007 | Lee |
| 2007/0126011 A1 | 6/2007 | Lee |
| 2008/0062682 A1 | 3/2008 | Hoelen et al. |
| 2010/0140633 A1 | 6/2010 | Emerson |
| 2010/0244061 A1 | 9/2010 | Shirakawa et al. |
| 2011/0267315 A1 | 11/2011 | Nakanishi et al. |
| 2012/0274878 A1 | 11/2012 | Kunz et al. |
| 2013/0106276 A1 | 5/2013 | Miyairi et al. |
| 2013/0170174 A1 | 7/2013 | Chou et al. |
| 2015/0001559 A1 | 1/2015 | Sasaoka et al. |
| 2015/0260351 A1 | 9/2015 | Hiramatsu et al. |
| 2015/0286123 A1 | 10/2015 | Tanaka |
| 2016/0040854 A1 | 2/2016 | Zhang |
| 2016/0087166 A1 | 3/2016 | Chang et al. |
| 2016/0290573 A1 | 10/2016 | Allen et al. |
| 2016/0308104 A1 | 10/2016 | Sasaoka et al. |
| 2017/0207377 A1 | 7/2017 | Sasaoka et al. |
| 2017/0229512 A1 | 8/2017 | Akagawa et al. |
| 2018/0254394 A1 | 9/2018 | Sasaoka et al. |
| 2019/0198559 A1 | 6/2019 | Miki et al. |

FOREIGN PATENT DOCUMENTS

| | | |
|---|---|---|
| JP | 2013515366 A | 5/2013 |
| JP | 2015029052 A | 2/2015 |
| JP | 2015060972 A | 3/2015 |
| JP | 2015176967 A | 10/2015 |

\* cited by examiner

LIGHT-EMITTING DEVICE

CROSS-REFERENCE TO RELATED PATENT APPLICATION

This is a continuation application of U.S. patent application Ser. No. 16/222,571, filed Dec. 17, 2018, which claims priority under 35 U.S.C. § 119 to Japanese Patent Application No. 2017-245665, filed Dec. 22, 2017, and Japanese Patent Application No. 2018-076518, filed Apr. 12, 2018. The entire disclosures of Japanese Patent Application No. 2017-245665, Japanese Patent Application No. 2018-076518 and U.S. patent application Ser. No. 16/222,571 are incorporated by reference herein.

BACKGROUND OF THE INVENTION

1. Field of the Invention

The present disclosure relates to a light-emitting device.

2. Description of Related Art

Japanese Unexamined Patent Application Publication No. 2007-158296 describes a light-emitting device including a blue-light emitting element, a green-light emitting element, and a red phosphor. A backlight device employing such a light-emitting device as a light source is considered to have a high color reproducibility.

SUMMARY

However, the light-emitting device in Japanese Unexamined Patent Application Publication No. 2007-158296 may cause unevenness in emission color because blue light and green light emitted from corresponding ones of the light-emitting elements has a high straightness.

Accordingly, certain embodiments of the present invention has an object to provide a light-emitting device with reduced unevenness in emission color.

A light-emitting device includes an inner light-emitting element having an n-sided polygonal shape (n is an integer of 3 or more) in a plan view with a peak emission wavelength in a range of 490 nm to 570 nm; m (m is an integer of 3 or more) outer light-emitting elements with a peak emission wavelength of 430 nm or greater and less than 490 nm; and a first phosphor with a peak emission wavelength in a range of 580 nm to 680 nm covering the inner light-emitting element and the m outer light-emitting elements. Each of n lateral surfaces of the inner light-emitting element faces a corresponding one of the m outer light-emitting elements in a top view.

Certain embodiments of the present invention allows for providing a light-emitting device with reduced unevenness in emission color.

DETAILED DESCRIPTION OF EMBODIMENTS

Figure 1A:
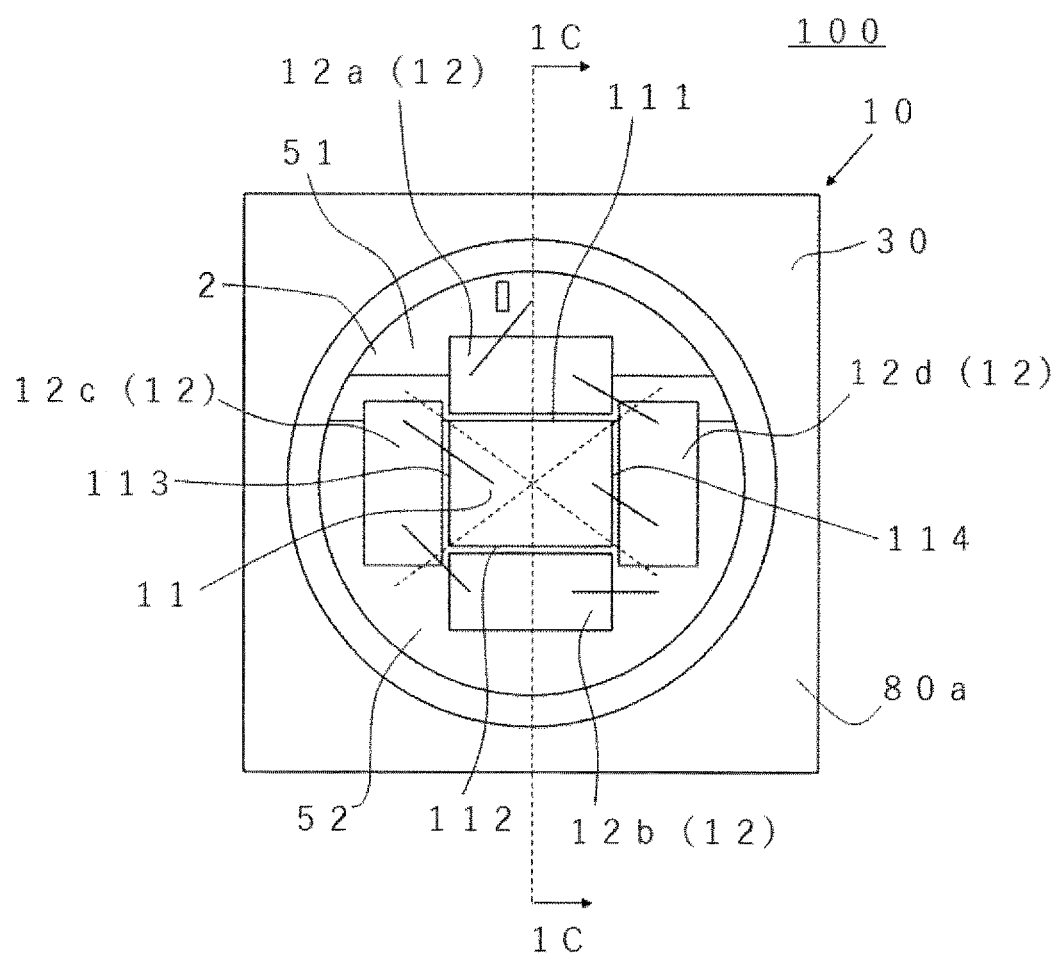
FIG. 1A is a schematic top view of a light-emitting device according to a first embodiment of the present disclosure.

Detailed descriptions are provided below on the basis of the accompanying drawings. Portions with the same reference numeral in a plurality of drawings represents the same or equivalent portions or members.

Descriptions below are intended to exemplify a light-emitting device to give a concrete form to the technical idea of the present invention and are not intended to limit the present invention thereto. Unless specifically stated otherwise, sizes, materials, shapes, and relative positions of constituent components described below are not intended to limit the scope of the present invention thereto but rather are intended to describe examples thereof. The descriptions below may include terms (such as "up", "down", and other terms inclusive of these terms) indicating specific directions or positions. These terms are used to facilitate understanding of relative directions or positions in the referenced drawings. Sizes or positional relationships of members illustrated in the drawings may be exaggerated in order to facilitate understanding. The relationships between color names and chromaticity coordinates, the relationships between wavelength regions of light and color names of monochromatic lights, and the like are based on JIS Z 8110.

First Embodiment

Figure 1B:
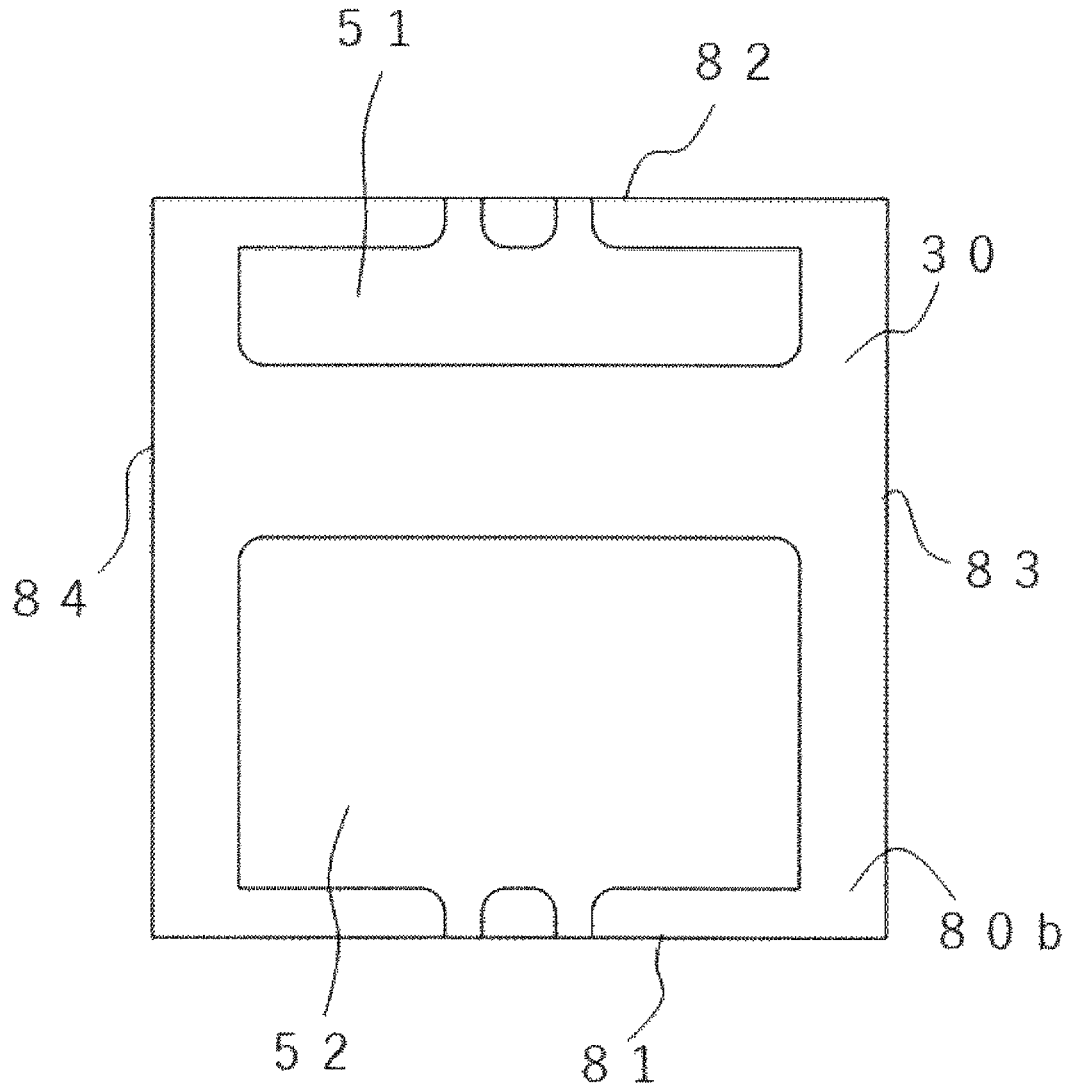
FIG. 1B is a schematic bottom view of the light-emitting device according to the first embodiment of the present disclosure.
Figure 1C:
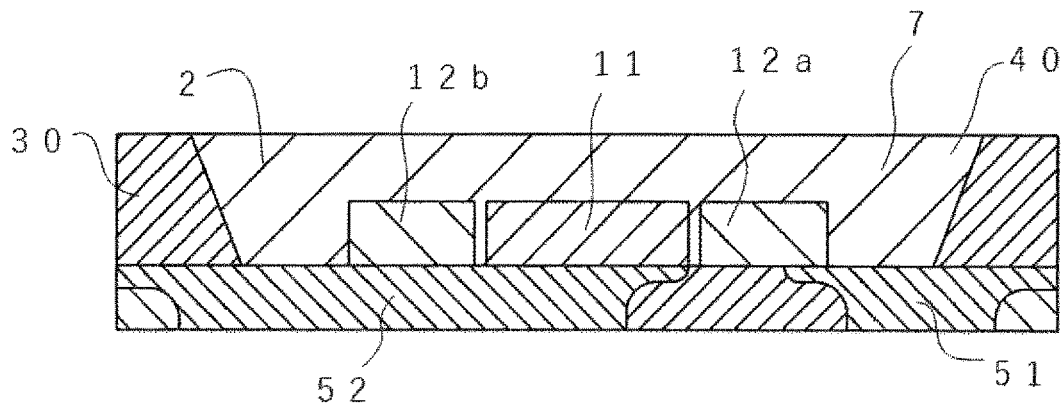
FIG. 1C is a schematic end view taken along the line 1C-1C of FIG. 1A.

FIG. 1A is a schematic top view of a light-emitting device 100 according to a first embodiment. FIG. 1B is a schematic bottom view of the light-emitting device 100. FIG. 1C is a schematic end view taken along the line 1C-1C of FIG. 1A. In FIG. 1A, illustrations of a first phosphor 7 and a sealing member 40 are omitted. The light-emitting device 100 includes an inner light-emitting element 11 having an n-sided polygonal shape (n is an integer of 3 or more) in a plan view with a peak emission wavelength in the range of 490 nm to 570 nm, m (m is an integer of 3 or more) outer light-emitting elements 12 with a peak emission wavelength of 430 nm or greater and less than 490 nm, and the first phosphor 7 with a peak emission wavelength in the range of 580 nm to 680 nm.

The inner light-emitting element 11 has n lateral surfaces. The inner light-emitting element 11 has, for example, a triangular, quadrilateral, or hexagonal shape in a top view and has three, four, or six lateral surfaces. The inner light-emitting element 11 is a light-emitting element with a peak emission wavelength in the range of 490 nm to 570 nm that emits green light.

The m outer light-emitting elements 12 are, for example, three outer light-emitting elements, four outer light-emitting elements, or five or more outer light-emitting elements. Each of the m outer light-emitting elements 12 faces at least one of the n lateral surfaces of the inner light-emitting element 11 in a top view. In other words, the inner light-emitting element 11 is disposed such that each of the n lateral surfaces of the inner light-emitting element 11 faces a corresponding one of the m outer light-emitting elements 12. Each of the m outer light-emitting elements 12 is a light-emitting element with a peak emission wavelength of 430 nm or greater and less than 490 nm that emits blue light.

The light-emitting device 100 shown in FIG. 1A is a light-emitting device in the case where n=m=4. The light-emitting device 100 includes an inner light-emitting element 11 having a quadrilateral planar shape and four outer light-emitting elements 12. The inner light-emitting element 11 and the four outer light-emitting elements 12 are located on or above the bottom surface of a recess 2. The inner light-emitting element 11 has a first lateral surface 111, a second lateral surface 112 opposite to the first lateral surface 111, a third lateral surface 113 connected to the first lateral surface 111 and the second lateral surface 112, and a fourth lateral surface 114 opposite to the third lateral surface 113 in a top view. The four outer light-emitting elements 12 of the light-emitting device 100 includes, a first light-emitting element 12a, a second light-emitting element 12b, a third light-emitting element 12c, and a fourth light-emitting element 12d. The first light-emitting element 12a faces the first lateral surface 111, the second light-emitting element 12b faces the second lateral surface 112, the third light-emitting element 12c faces the third lateral surface 113, and the fourth light-emitting element 12d faces the fourth lateral surface 114.

With the m outer light-emitting elements 12 disposed such that the outer light-emitting elements 12 face the lateral surfaces of the inner light-emitting element 11, the color of light emitted from the lateral surfaces of the inner light-emitting element 11 can be easily mixed with the color of light emitted from the m outer light-emitting elements 12. By sufficiently mixing the color of light emitted from the inner light-emitting element 11 with the color of light emitted from the m outer light-emitting elements 12, unevenness in emission color of the light-emitting device can be easily reduced. The expression "face" as used herein encompasses not only the case where all of the lateral surfaces of the inner light-emitting element 11 faces an entirety of a corresponding one of the lateral surfaces of each of the outer light-emitting elements 12, but also the case where a portion of a lateral surface of the inner light-emitting element 11 faces a corresponding one of the lateral surfaces of a corresponding one of the outer light-emitting elements 12, and the case where a lateral surface of the inner light-emitting element 11 faces a portion of a corresponding one of the lateral surfaces of a corresponding one of the outer light-emitting elements 12. Each of the outer light-emitting elements 12 preferably faces 50% or more, more preferably 75% or more, further preferably 100% (i.e., an entirety) of a respective one of the lateral surfaces of the inner light-emitting element 11. With this structure, the colors of light emitted from the inner light-emitting element 11 and light emitted from the outer light-emitting elements can be effectively mixed.

In the light-emitting device 100 shown in FIG. 1A, in a top view, the third light-emitting element 12c and the fourth light-emitting element 12d overlap the extension lines of the diagonal lines of the inner light-emitting element 11. The third light-emitting element 12c and the fourth light-emitting element 12d face at least a portion of the first light-emitting element 12a and the second light-emitting element 12b, respectively, in addition to corresponding lateral surfaces of the inner light-emitting element 11 in a top view. With this structure, for example, the color of light emitted from the corner portions of the inner light-emitting element 11 can be effectively mixed with the color of light emitted from the outer light-emitting elements.

It is preferable that a distance in a top view between each of the outer light-emitting elements and the inner light-emitting element 11 be small. With this structure, the colors of light emitted from the inner light-emitting element 11 and light emitted from the outer light-emitting elements can be effectively mixed. A distance between each of the outer light-emitting elements and the inner light-emitting element 11 is, for example, 100 μm or less, preferably 50 μm or less, more preferably 40 μm or less. Also, the distance between each of the outer light-emitting elements and the inner light-emitting element 11 is, for example, one half or less, preferably one quarter or less, of the height of a respective one of the outer light-emitting elements or the inner light-emitting element 11.

The inner light-emitting element 11 and the m outer light-emitting elements 12 are preferably connected in series. With this structure, a light-emitting device that exhibits high emission intensity when a predetermined current is applied can be provided. In the light-emitting device 100 shown in FIG. 1A, a first lead 51 is connected to a corresponding one of electrodes of the first light-emitting element 12a by a wire, and the other electrode of the first light-emitting element 12a is connected to a corresponding one of electrodes of the fourth light-emitting element 12d by a wire. Also, the other electrode of the fourth light-emitting element 12d is connected to a corresponding one of electrodes of the inner light-emitting element 11 by a wire, and the other electrode of the inner light-emitting element 11 is connected to a corresponding one of electrodes of the third light-emitting element 12c by a wire. In addition, the other electrode of the third light-emitting element 12c is connected to a corresponding one of electrodes of the second light-emitting element 12b by a wire, and the other electrode of the second light-emitting element 12b is connected to a second lead 52 by a wire.

In the light-emitting device of the present disclosure, the manner of electrically connecting the light-emitting elements is not limited to the above manner. The inner light-emitting element 11 and the m outer light-emitting elements 12 may be all connected in parallel, or parallel connections and series connections may be combined.

The light-emitting device 100 includes the first phosphor 7 with a peak emission wavelength in the range of 580 nm to 680 nm. For example, the first phosphor 7 is adapted to absorb blue light emitted from the outer light-emitting elements and to emit red light. It is preferable that the first phosphor 7 be a phosphor that adapted to emit almost no red light when it absorbs green light emitted from the inner light-emitting element 11. In other words, it is preferable that the first phosphor 7 be a phosphor that does not substantially convert green light into red light. Using a phosphor that is less likely to perform wavelength conversion of green light for the first phosphor 7 allows for designing the output balance of the light-emitting device only in consideration of wavelength conversion of blue light emitted from the m outer light-emitting elements 12. Accordingly, designing of the light-emitting device can be facilitated.

Such preferable examples of the first phosphor 7 include phosphors described below. The first phosphor 7 can include a first-type phosphor and/or a second-type phosphor described below.

The first-type phosphor is a red phosphor having a composition represented by the following general formula (I).

$$A_2MF_6:Mn^{4+} \tag{I}$$

In the above general formula (I), A is at least one selected from the group consisting of K, Li, Na, Rb, Cs, and $NH^{4+}$, and M is at least one element selected from the group consisting of the group IV elements and the group XIV elements.

The "group IV elements" herein refers to titanium (Ti), zirconium (Zr), and hafnium (Hf). The "group XIV elements" herein refers to silicon (Si), germanium (Ge), tin (Sn), and lead (Pb).

Specific examples of the first-type phosphor include $K_2SiF_6:Mn^{4+}$, $K_2(Si,Ge)F_6:Mn^{4+}$, and $K_2TiF_6:Mn^{4+}$.

The second-type phosphors is a phosphor having a composition represented by $3.5MgO.0.5MgF_2.GeO_2:Mn^{4+}$ or a phosphor having a composition represented by the following general formula (II).

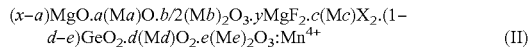

$$(x-a)MgO.a(Ma)O.b/2(Mb)_2O_3.yMgF_2.c(Mc)X_2.(1-d-e)GeO_2.d(Md)O_2.e(Me)_2O_3:Mn^{4+} \tag{II}$$

In the above general formula (II), Ma is at least one selected from Ca, Sr, Ba, and Zn; Mb is at least one selected from Sc, La, and Lu; Mc is at least one selected from Ca, Sr, Ba, and Zn; X is at least one selected from F and Cl; Md is at least one selected from Ti, Sn, and Zr; and Me is at least one selected from B, Al, Ga, and In. Also, x, y, a, b, c, d, and e satisfy $2 \leq x \leq 4$, $0 < y \leq 2$, $0 \leq a \leq 1.5$, $0 \leq b < 1$, $0 \leq c \leq 2$, $0 \leq d \leq 0.5$, and $0 \leq e < 1$.

It is preferable that the light-emitting device 100 include a package 10 having the recess 2 as shown in FIG. 1A. With the inner light-emitting element 11 and the m outer light-emitting elements 12 on the bottom surface of the recess 2, the colors of light emitted from the light-emitting elements can be easily mixed.

The package 10 shown in FIG. 1A and FIG. 1B includes a resin portion 30, the first lead 51, and the second lead 52. A portion of the upper surface of the first lead 51 and a portion of the upper surface of the second lead 52 is exposed from the resin portion 30 on the bottom surface of the recess 2.

The package 10 has an upper surface 80a and a lower surface 80b opposite to the upper surface 80a. The package 10 has a substantially rectangular external shape in a top view and also has a first outer lateral surface 81, a second outer lateral surface 82 opposite to the first outer lateral surface 81, a third outer lateral surface 83, and a fourth outer lateral surface 84 opposite to the third outer lateral surface 83.

The lower surface 80b of the package 10 serves as a mounting surface to be mounted on a mounting board. The first lead 51 and the second lead 52 are exposed from the resin portion 30 on the lower surface 80b of the package 10.

Members used for the light-emitting device 100 according to certain embodiments of the present invention will be described below in detail.

Inner Light-Emitting Element and Outer Light-Emitting Elements

The light-emitting device 100 includes the inner light-emitting element 11 having the n-sided polygonal shape (n is an integer of 3 or more) in a plan view and the m (m is an integer of 3 or more) outer light-emitting elements 12. The inner light-emitting element 11 and the m outer light-emitting elements 12 function as light sources of the light-emitting device 100. Light-emitting diode elements or the like can be used for the inner light-emitting element 11 and the m outer light-emitting elements 12. Nitride semiconductors ($In_xAl_yGa_{1-x-y}N$, where $0 \leq x$, $0 \leq y$, and $x+y \leq 1$), which can emit visible light, are preferably used.

The inner light-emitting element 11 is a light-emitting element with a peak emission wavelength in the range of 490 nm to 570 nm that emits green light. Each of the m outer light-emitting elements 12 is a light-emitting element with a peak emission wavelength of 430 nm or greater and less than 490 nm that emits blue light. A light-emitting element having a half band-width of 40 nm or less, more preferably 30 nm or less, is preferably used for each of the inner light-emitting element 11 and the m outer light-emitting elements 12. With such a light-emitting element, blue and green light having sharp emission peaks can be easily obtained. Accordingly, for example, in the case where the light-emitting device 100 is used as a light source for a liquid-crystal display, a liquid-crystal display with good color reproducibility can be provided.

The inner light-emitting element 11 and the outer light-emitting elements 12 can be bonded to the package 10 or a mounting board using die-bonding members. Examples of the die-bonding members include resins such as thermosetting resins and thermoplastic resins; solders such as tin-bismuth, tin-copper, tin-silver, and gold-tin solders; eutectic alloys such as alloys containing mainly Au and Sn, alloys containing mainly Au and Si, and alloys containing mainly Au and Ge; electrically-conductive pastes of silver, gold, and palladium; bumps; anisotropic conductive materials; and brazing materials of low-melting-point metals.

The die-bonding members can contain a light-reflective substance with a high light reflectance or a light-absorbing material that is likely to absorb light, in accordance with the purpose. Examples of the light-reflective substance include titanium oxide, zinc oxide, silicon oxide, zirconium oxide, aluminum oxide, and aluminum nitride. Examples of the light-absorbing material include carbon materials such as acetylene black, activated carbon, and graphite; transition metal oxides such as iron oxide, manganese dioxide, cobalt oxide, and molybdenum oxide; and colored organic pigments.

With a light-reflective substance or a light-absorbing material contained in the die-bonding members, for example, the chromaticity of light emitted from the light-emitting device 100 can be close to a desired chromaticity. More specifically, the more the green light component of light emitted from the light-emitting device 100, the greater they value of the chromaticity of light emitted from the light-emitting device 100 in the 1931 CIE chromaticity diagram tends to, and the less the green light component of light emitted from the light-emitting device 100, the smaller the y value tends to. In this regard, in the case where a light-emitting device configured to emit light having a chromaticity with a high y value is to be provided, for example, the die-bonding members for the inner light-emitting element 11 (i.e., green light-emitting element) can contain a light-reflective substance. This structure allows for efficiently extracting light emitted from the inner light-emitting element 11, and a light-emitting device configured to emit light having a chromaticity with a high y value can be therefore easily provided. Similarly, in the case where a light-emitting device configured to emit light having a chromaticity with a low y value is to be provided, for example, the die-bonding members for the inner light-emitting element 11 (i.e., green light-emitting element) can contain a light-absorbing material. A portion of light emitted downward from the inner light-emitting element 11 is thus absorbed by the light-absorbing material, and the green light component of the light-emitting device 100 can be reduced. A light-emitting device configured to emit light having a chromaticity with a low y value can be therefore easily provided.

Instead of or in addition to the die-bonding members for the inner light-emitting element 11, the die-bonding members for the outer light-emitting elements 12 may contain a light-reflective substance or a light-absorbing material depending on the purpose. In the case where a plurality of inner light-emitting elements 11 or a plurality of outer light-emitting elements 12 are disposed, for example, all the die-bonding members for the inner light-emitting elements 11 may contain a light-reflective substance, or some of the die-bonding members for the inner light-emitting elements 11 may contain a light-reflective substance. In addition, the contents of the light-reflective substance or the like in the die-bonding members may be the same in all die-bonding members, or may be different from one another or among some of the die-bonding members.

The light-emitting device 100 shown in FIG. 1A includes the inner light-emitting element 11 having a quadrilateral planar shape and four outer light-emitting elements 12. The light-emitting device according to the present disclosure is not limited to this structure. In the light-emitting device 100, the planar shape of the inner light-emitting element 11, the number m of the outer light-emitting elements 12, the arrangement of the inner light-emitting element 11 and the m outer light-emitting elements 12, and the like can be changed in accordance with the purpose and the intended use.

Light-emitting devices shown in FIG. 2A to FIG. 2F are variant examples of the light-emitting device 100. In FIG. 2A to FIG. 2F, illustrations of the wires and the sealing members 40 are omitted.

Figure 2A:
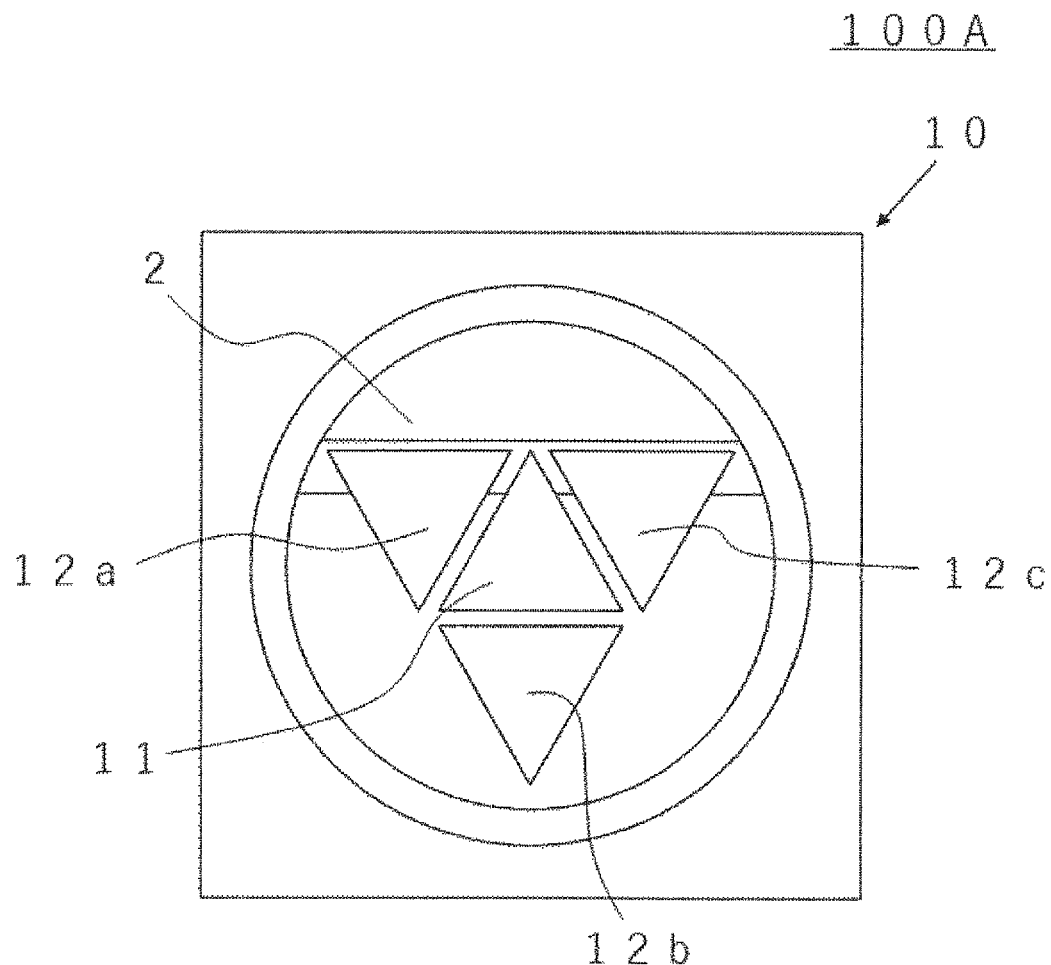
FIG. 2A is a schematic top view of a variant example of a light-emitting device of the present disclosure.
Figure 2B:
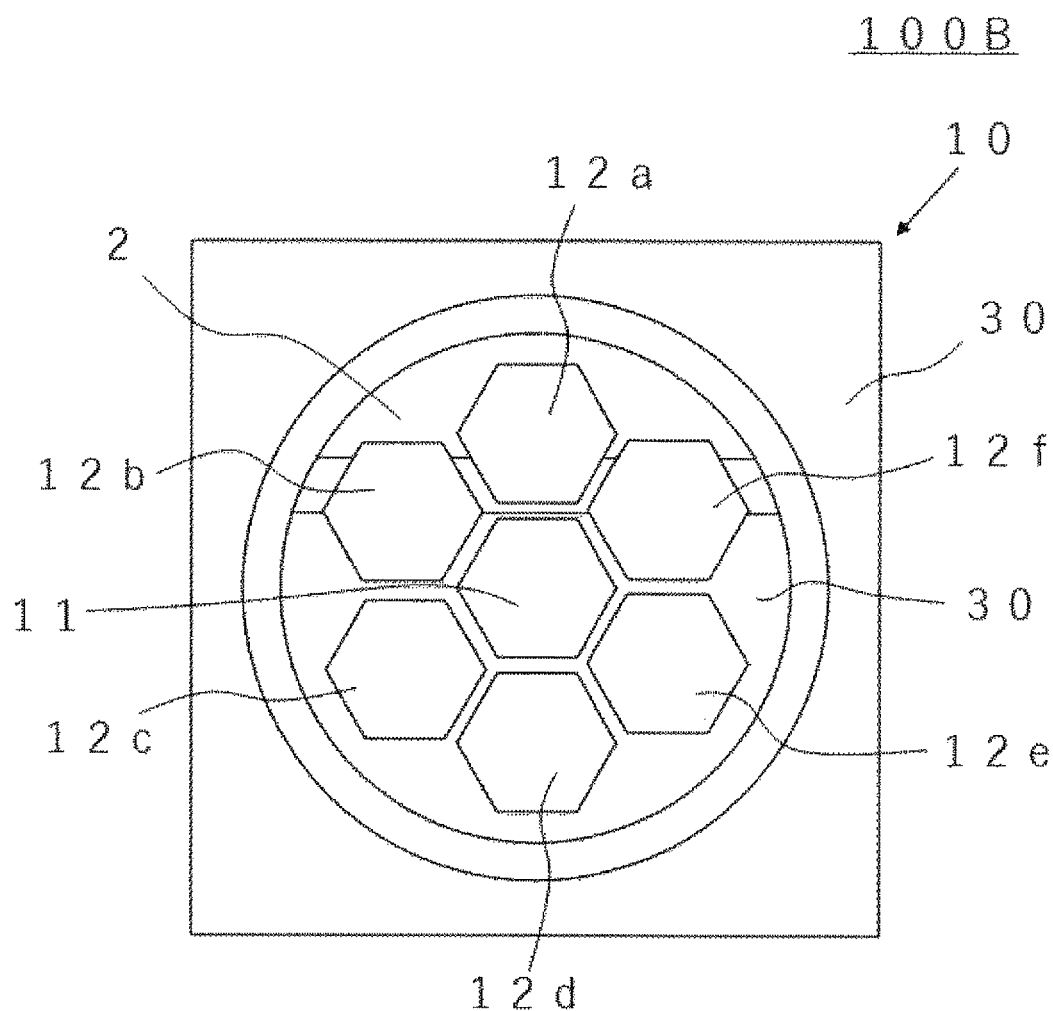
FIG. 2B is a schematic top view of another variant example of a light-emitting device of the present disclosure.

Light-emitting devices 100A and 100B shown in FIG. 2A and FIG. 2B differ from the light-emitting device 100 mainly in the planar shape of the inner light-emitting element 11 and the number (i.e., value of m) of the outer light-emitting elements 12. The light-emitting device 100A in FIG. 2A is a light-emitting device in the case where n=m=3. The light-emitting device 100A includes an inner light-emitting element 11 having a triangular planar shape and three outer light-emitting elements, which include a first light-emitting element 12a, a second light-emitting element 12b, and a third light-emitting element 12c. Each of the first light-emitting element 12a, the second light-emitting element 12b, and the third light-emitting element 12c faces a respective one of the lateral surfaces of the inner light-emitting element 11. In the light-emitting device 100A, each single outer light-emitting element faces a corresponding one of the lateral surfaces of the inner light-emitting element 11. This allows for effectively mixing the color of light emitted from the lateral surfaces of the inner light-emitting element 11 and the color of light emitted from the outer light-emitting elements.

The light-emitting device 100B in FIG. 2B is a light-emitting device in the case where n=m=6. The light-emitting device 100B includes an inner light-emitting element 11 having a hexagonal planar shape and six outer light-emitting elements, which include a first light-emitting element 12a, a second light-emitting element 12b, a third light-emitting element 12c, a fourth light-emitting element 12d, a fifth light-emitting element 12e, and a sixth light-emitting element 12f. Each of the first to sixth light-emitting elements 12a to 12f faces a respective one of the lateral surfaces of the inner light-emitting element 11. In the light-emitting device 100B, each outer light-emitting element faces a corresponding one of the lateral surfaces of the inner light-emitting element 11. This allows for effectively mixing the color of light emitted from the lateral surfaces of the inner light-emitting element 11 and the color of light emitted from the outer light-emitting elements. A shape of the outline of the m outer light-emitting elements 12 in a top view in the light-emitting device 100B is closer to a circle than that in the light-emitting device 100. Accordingly, light emitted from the inner light-emitting element 11 and the m outer light-emitting elements 12 is efficiently extracted to the outside from the light-emitting device 100B having the recess 2 with a circular opening. Further, the light-emitting device 100B includes a greater number of outer light-emitting elements than the light-emitting device 100, which allows the electric current passing through each light-emitting element to be smaller than that in the light-emitting device 100 when operating on the same electric power. The light-emitting device 100B can be therefore safely handled.

Figure 2C:
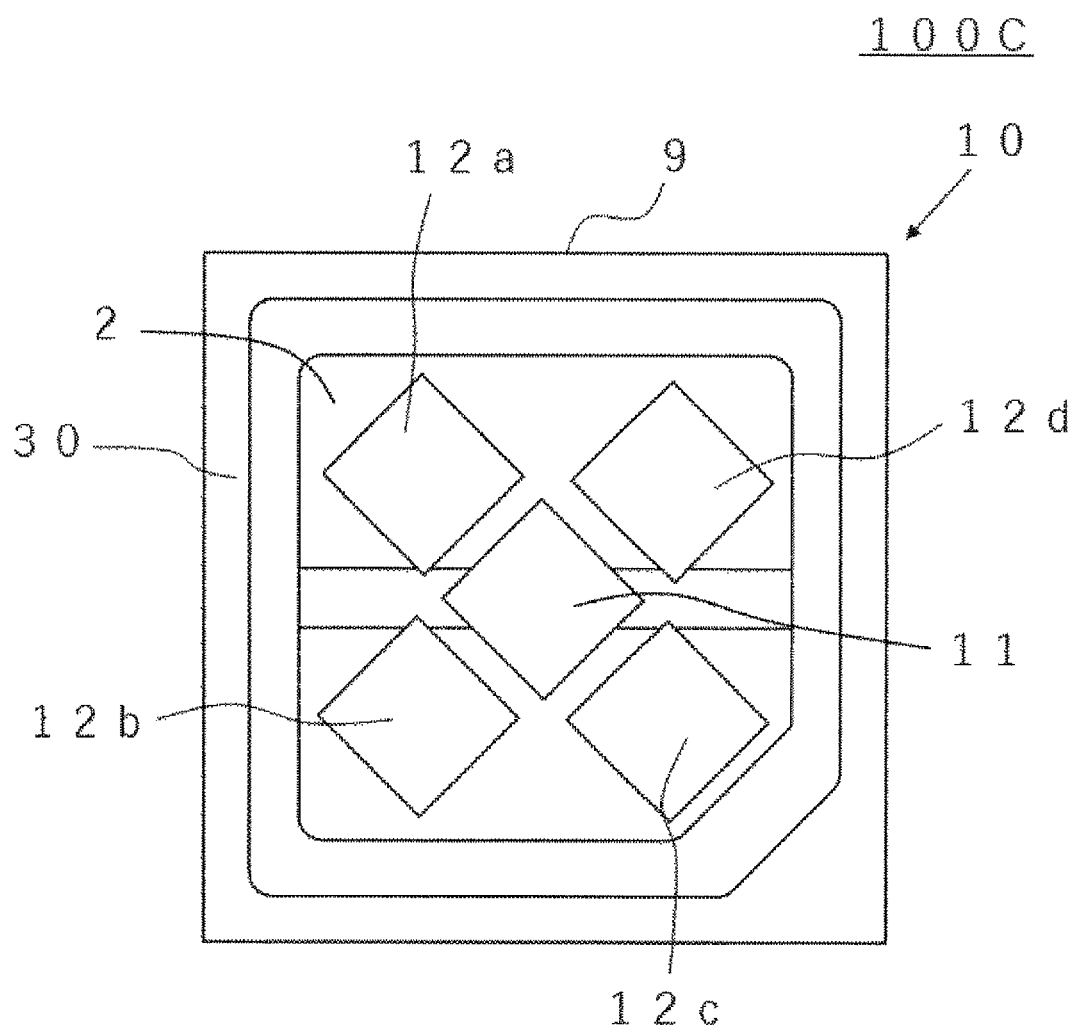
FIG. 2C is a schematic top view of even another variant example of a light-emitting device of the present disclosure.

A light-emitting device 100C shown in FIG. 2C differs from the light-emitting device 100 mainly in that the inner light-emitting element 11 and the m outer light-emitting elements 12 are arranged to be inclined with respect to a corresponding one of outer lateral surfaces 9 of the package 10 in a top view. The light-emitting device 100C is a light-emitting device in the case where n=m=4. The light-emitting device 100C includes an inner light-emitting element 11 having a quadrilateral planar shape and four outer light-emitting elements, which include a first light-emitting element 12a, a second light-emitting element 12b, a third light-emitting element 12c, and a fourth light-emitting element 12d. The inner light-emitting element 11 and the four outer light-emitting elements are arranged to be inclined with respect to the outer lateral surface 9 of the package 10 in a top view. With this arrangement, a distance between each of the inner lateral surfaces of the recess 2 and a corresponding one of the lateral surfaces of a corresponding one of the outer light-emitting elements can be larger than that in the light-emitting device 100, so that, for example, deterioration of the resin portion 30 constituting the inner lateral surfaces of the recess 2 due to heat and light generated from the outer light-emitting elements can be reduced.

Figure 2D:
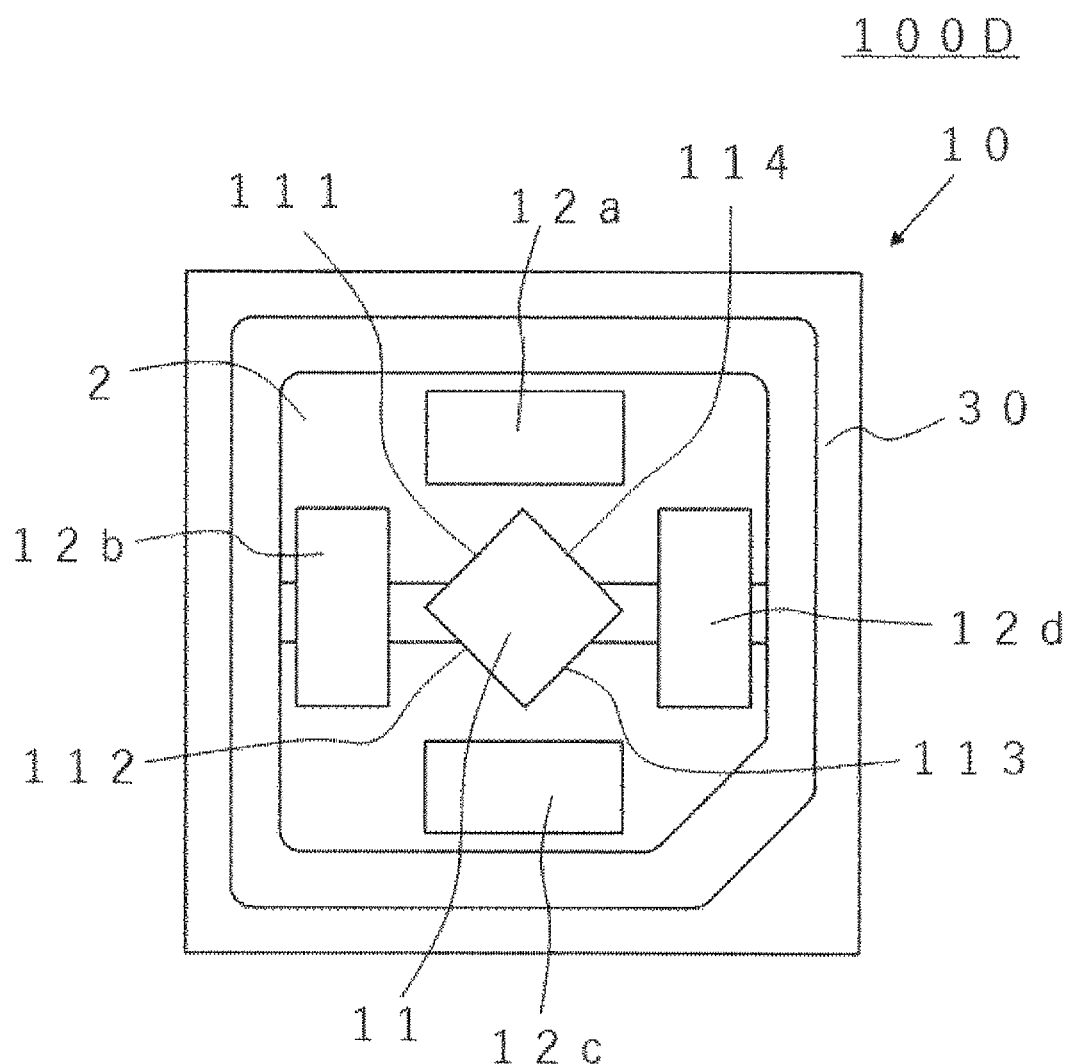
FIG. 2D is a schematic top view of still another variant example of a light-emitting device of the present disclosure.

A light-emitting device 100D shown in FIG. 2D differs from the light-emitting device 100 mainly in that each of the lateral surfaces of the inner light-emitting element 11 are not parallel to a corresponding one of the lateral surfaces of a corresponding one of the outer light-emitting elements facing the corresponding one of the lateral surfaces of the inner light-emitting element 11. The light-emitting device 100D is a light-emitting device in the case where n=m=4. The light-emitting device 100D includes an inner light-emitting element 11 having a quadrilateral planar shape and four outer light-emitting elements, which include a first light-emitting element 12a, a second light-emitting element 12b, a third light-emitting element 12c, and a fourth light-emitting element 12d. The inner light-emitting element 11 has the first lateral surface 111, the second lateral surface 112, the third lateral surface 113, and the fourth lateral surface 114. The first lateral surface 111 of the inner light-emitting element 11 faces both a corresponding one of the lateral surfaces of the first light-emitting element 12a and a corresponding one of the lateral surfaces of the second light-emitting element 12b. The second lateral surface 112 of the inner light-emitting element 11 faces both a corresponding one of the lateral surfaces of the second light-emitting element 12b and a corresponding one of the lateral surfaces of the third light-emitting element 12c. The third lateral surface 113 of the inner light-emitting element 11 faces both a corresponding one of the lateral surfaces of the third light-emitting element 12c and a corresponding one of the lateral surfaces of the fourth light-emitting element 12d. The fourth lateral surface 114 of the inner light-emitting element 11 faces both a corresponding one of the lateral surfaces of the first light-emitting element 12a and a corresponding one of the lateral surfaces of the fourth light-emitting element 12d. The first lateral surface 111, the second lateral surface 112, the third lateral surface 113, and the fourth lateral surface 114 are arranged to be inclined with respect to corresponding ones of the lateral surfaces of the first to fourth light-emitting elements 12a to 12d, respectively. With this arrangement, a distance between the inner light-emitting element 11 and each of the outer light-emitting elements in the light-emitting device 100D can be larger than that in the light-emitting device 100, so that possibility of occurrence of deterioration of the sealing member between the inner light-emitting element 11 and the outer light-emitting elements due to light and heat generated from the light-emitting elements can be reduced.

Figure 2E:
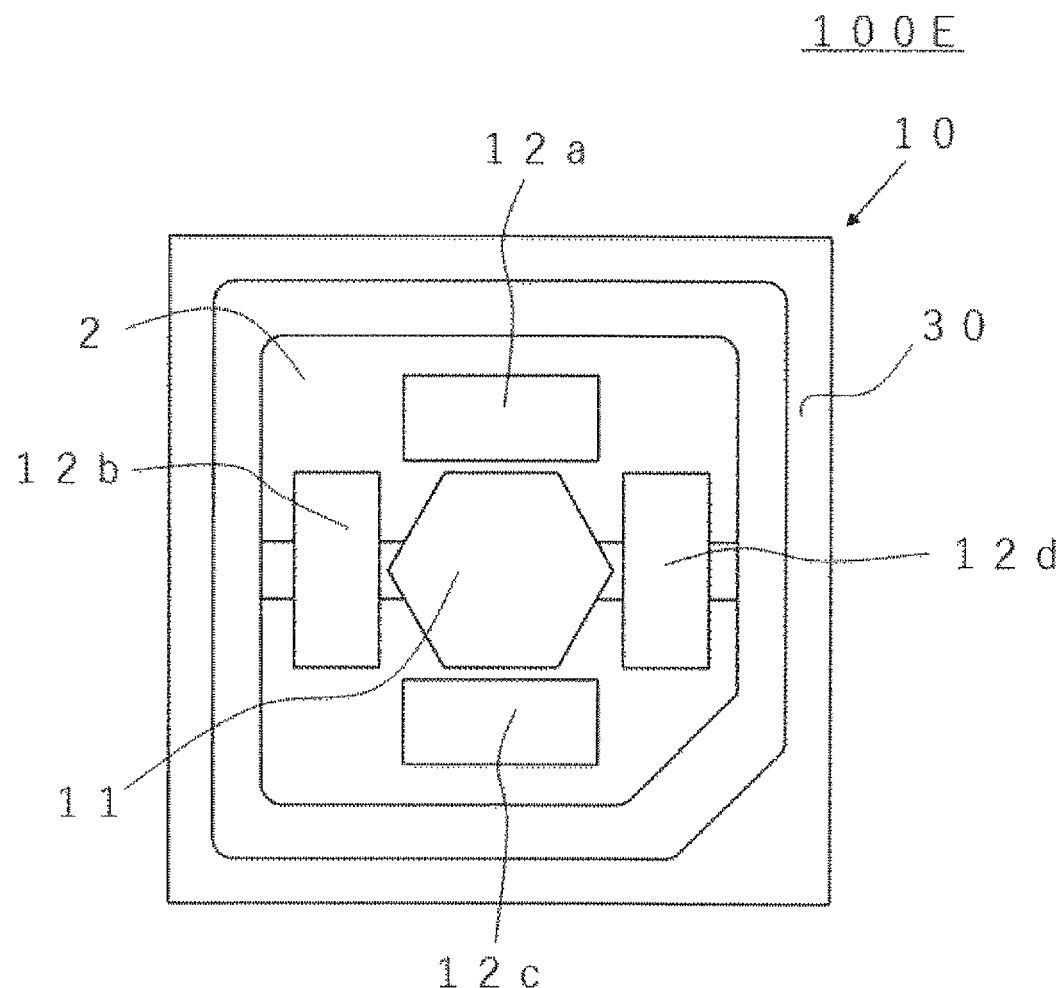
FIG. 2E is a schematic top view of yet another variant example of a light-emitting device of the present disclosure.

A light-emitting device 100E shown in FIG. 2E differs from the light-emitting device 100 mainly in that n m. The light-emitting device 100E shown in FIG. 2E is a light-emitting device in the case where n=6 and m=4. The light-emitting device 100E includes an inner light-emitting element 11 having a hexagonal planar shape, and four outer light-emitting elements, which include a first light-emitting element 12a, a second light-emitting element 12b, a third light-emitting element 12c, and a fourth light-emitting element 12d. The number of the outer light-emitting elements in the light-emitting device 100E can be smaller than in a light-emitting device including a single outer light-emitting element for each of the lateral surfaces of the inner light-emitting element 11. Accordingly, an inexpensive light-emitting device with reduced unevenness in color can be provided. Further, a distance between the inner light-emitting element 11 and each of the outer light-emitting elements in the light-emitting device 100E is larger than that in the light-emitting device 100, so that the possibility of occurrence of deterioration of the sealing member between the inner light-emitting element 11 and the outer light-emitting elements due to light and heat generated from the light-emitting elements can be reduced.

Figure 2F:
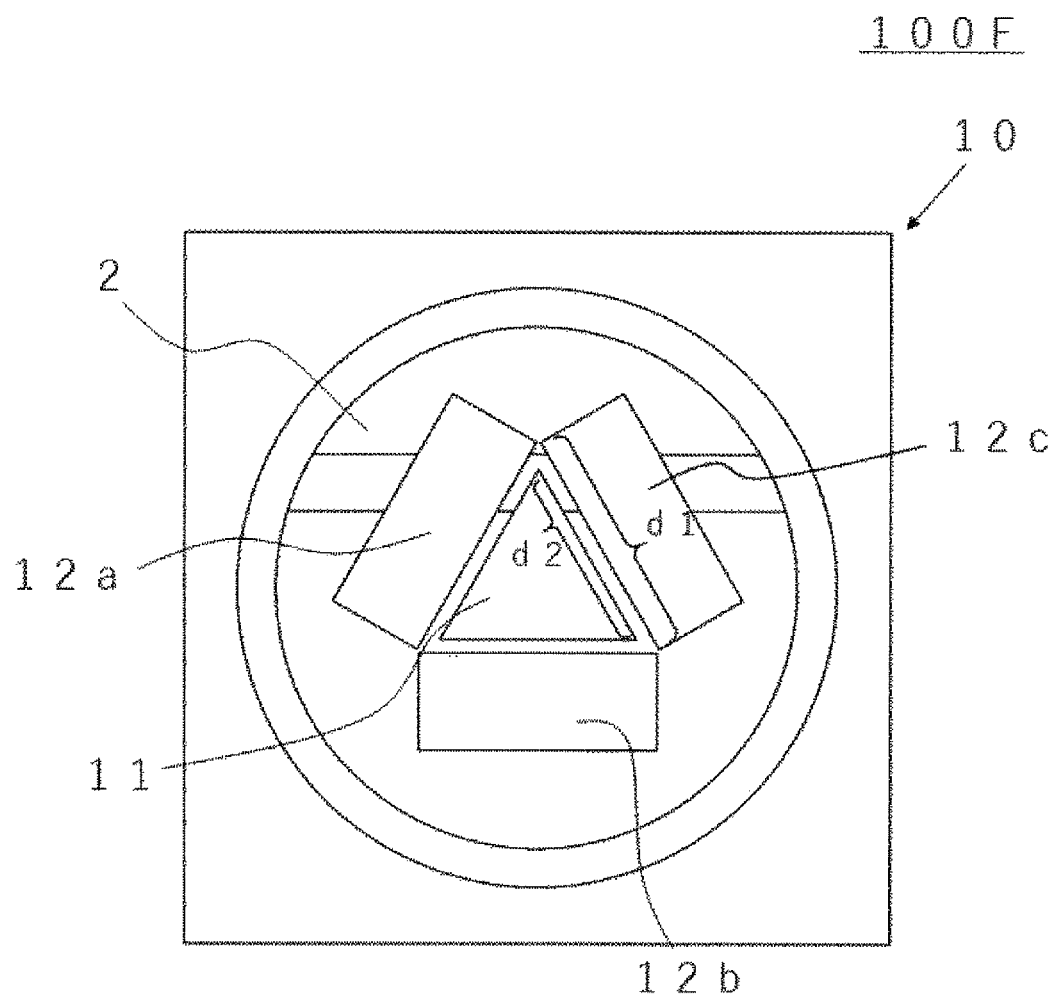
FIG. 2F is a schematic top view of still another variant example of a light-emitting device of the present disclosure.

A light-emitting device 100F shown in FIG. 2F is a light-emitting device in the case where n=m=3. The light-emitting device 100F includes an inner light-emitting element 11 having a triangular planar shape and three outer light-emitting elements each having a quadrilateral planar shape: a first light-emitting element 12a, a second light-emitting element 12b, and a third light-emitting element 12c. Each of the first light-emitting element 12a, the second light-emitting element 12b, and the third light-emitting element 12c faces a respective one of the lateral surfaces of the inner light-emitting element 11. In the light-emitting device 100F, in a top view, a length d1 of a side of each of the first light-emitting element 12a, the second light-emitting element 12b, and the third light-emitting element 12c facing the inner light-emitting element 11 is preferably longer than a length d2 of a corresponding side of the sides of the inner light-emitting element 11. With this structure of the light-emitting device 100F, for example, the color of light laterally emitted from the inner light-emitting element 11 can be efficiently mixed with the color of light emitted from the outer light-emitting elements. Accordingly, a light-emitting device with a smaller unevenness in color can be provided.

First Phosphor

The light-emitting device 100 includes the first phosphor 7 that performs wavelength-conversion of light emitted from the light-emitting elements. The first phosphor 7 is a phosphor with a peak emission wavelength in the range of 580 nm to 680 nm. The first phosphor 7 is contained in, for example, a resin material such as a silicone resin. The resin material can be formed by printing, potting, or spraying. Alternatively, the first phosphor 7 may be contained in, for example, a resin member in a form of a sheet or a block, glass, or a ceramic, and the resin member or the like may be applied using an adhesive. Also, the first phosphor 7 may be formed by electrophoretic deposition.

For example, a $(Sr,Ca)AlSiN_3$:Eu, $K_2SiF_6$:$Mn^{4+}$, or $3.5MgO.0.5MgF_2.GeO_2$:$Mn^{4+}$ phosphor can be used for the first phosphor 7. In particular, a $K_2SiF_6$:$Mn^{4+}$ phosphor can be preferably used. A phosphor that shows a narrow half band-width is preferably used for the first phosphor 7. With such a phosphor, for example, in the case where the light-emitting device 100 is used as a light source for a liquid-crystal display device, a liquid-crystal display device with good color reproducibility can be provided. The half band-width of the first phosphor 7 is, for example, 30 nm or less, preferably 15 nm or less.

In addition to the first phosphor 7, the light-emitting device 100 can further include a phosphor other than the first phosphor 7. Examples of the phosphor include $(Ca,Sr,Ba)_5(PO_4)_3(Cl,Br)$:Eu, $Si_{6-z}Al_zO_zN_{8-z}$:Eu(0<z<4.2), $(Sr,Ca,Ba)_4Al_{14}O_{25}$:Eu, $(Ca,Sr,Ba)_8MgSi_4O_{16}(F,Cl,Br)_2$:Eu, $(Y,Lu,Gd)_3(Al,Ga)_5O_{12}$:Ce, $Ca_3Sc_2Si_3O_{12}$:Ce, and $CaSc_2O_4$:Ce phosphors.

Sealing Member

The light-emitting device 100 can include the sealing member 40 that contains the first phosphor 7 and covers the inner light-emitting element 11 and the m outer light-emitting elements 12. The sealing member 40 can protect the light-emitting elements and other components from external force, dust, and water. The sealing member 40 preferably transmits 60% or more, further preferably 90% or more, of light emitted from the light-emitting elements. A thermosetting resin or a thermoplastic resin can be used for a resin material to serve as the base material for the sealing member 40. For example, a silicone resin, an epoxy resin, an acrylic resin, or a resin containing one or more of the above resins can be used. The sealing member may be constituted of a single layer or a plurality of layers. Also, light scattering particles such as titanium oxide, silicon oxide, zirconium oxide, and aluminum oxide may be dispersed in the sealing member 40. The light scattering particles may have crushed, spherical, hollow, or porous shapes.

Package

The light-emitting device 100 can include the package 10. The package 10 is a base on which the light-emitting elements are to be disposed. The package 10 includes at least a matrix and a plurality of leads (a plurality of electrode portions). The package 10 preferably has the recess 2. With the inner light-emitting element 11 and the m outer light-emitting elements 12 disposed on the bottom surface of the recess 2, unevenness in color of the light-emitting device can be easily reduced. Examples of the material of the base material of the package 10 include ceramics such as aluminum oxide and aluminum nitride, resins (such as silicone resins, modified silicone resins, epoxy resins, modified epoxy resins, unsaturated polyester resins, phenolic resins, polycarbonate resins, acrylic resins, trimethylpentene resin, polynorbornene resin, and hybrid resins each containing one or more of the above resins), pulp, glass, and composite materials of these materials.

The external shape of the package 10 in a top view is, for example, a quadrilateral shape with a dimension of 3.0 mm×1.4 mm, 2.5 mm×2.5 mm, 3.0 mm×3.0 mm, or 4.5 mm×4.5 mm. The external shape of the package 10 in a top view is not limited to a quadrilateral shape but may be another polygonal shape or an elliptic shape.

For the package 10, the package used in the light-emitting device 100 shown in FIG. 1A, which includes the resin portion 30, the first lead 51, and the second lead 52, can be preferably used. This structure allows for providing an inexpensive light-emitting device with high heat dissipation performance. Although the first lead 51 and the second lead 52 do not extend outward from the resin portion 30 on the outer lateral surfaces of the package 10 in the light-emitting device 100 shown in FIG. 1A, the light-emitting device according to the present embodiment is not limited to thereto. In other words, the first lead 51 and the second lead 52 may extend outward from the resin portion 30 at the outer lateral surfaces of the package 10. This structure allows for efficiently dissipating heat generated from the light-emitting elements into the outside.

Resin Portion

A thermosetting resin or a thermoplastic resin can be used for the resin material to serve as the base material of the resin portion 30. Specific examples of the resin material include epoxy resin compounds, silicone resin compounds, modified epoxy resin compositions such as silicone-modified epoxy resins, modified silicone resin compounds such as epoxy-modified silicone resins, modified silicone resin compounds, unsaturated polyester resins, saturated polyester resins, polyimide resin compounds, and modified polyimide resin compounds; resins such as polyphthalamide (PPA), polycarbonate resins, poly(phenylene sulfide) (PPS), liquid crystal polymers (LCPs), ABS resins, phenolic resins, acrylic resins, and PBT resins. In particular, a thermosetting resin, such as epoxy resin compounds and silicone resin compounds, having good resistance to heat and light is preferably used for the resin material of the resin portion 30.

It is preferable that the resin portion 30 contain a light-reflective substance mixed in the resin material to serve as the base material. For the light-reflective substance, a member that is less likely to absorb light emitted from the light-emitting elements and greatly differs in refractive index from the resin material to serve as the base material is preferable. Examples of such a light-reflective substance include titanium oxide, zinc oxide, silicon oxide, zirconium oxide, aluminum oxide, and aluminum nitride.

First Lead and Second Lead

The first lead 51 and the second lead 52 is electrically conductive and function as electrodes used for supplying electricity to the light-emitting elements. For a base portion of the first lead 51 and the second lead 52, for example, metals such as copper, aluminum, gold, silver, iron, nickel, alloys of these metals, phosphor bronze, or copper-iron alloys can be used. A single layer or a layered structure (such as a clad material) may be employed. It is particularly preferable that copper, which is inexpensive and has high heat dissipation performance, be used for the base portion.

The first lead 51 and/or the second lead 52 may include metal layers on the surfaces of the base member. The metal layers contain, for example, silver, aluminum, nickel, palladium, rhodium, gold, copper, or an alloy of these metals. The metal layers may be disposed on the entirety of the surfaces of the first lead 51 and the second lead 52, or a part of a surface of the first lead 51 and/or a surface of the second lead 52. The metal layer formed on the upper surface of the first lead 51 and/or the upper surface of the second lead 52 may be different from the metal layer formed on the lower surface of the first lead 51 and/or the upper surface of the second lead 52. For example, the metal layer formed on the upper surface of each of the first and second leads 51 and 52 has a layered structure including nickel and silver layers, and the metal layer formed on the lower surface of each of the first and second leads 51 and 52 does not include a nickel layer.

In the case where metal layers containing silver are formed on an outermost surface of the first lead 51 and/or an outermost surface of the second lead 52, it is preferable that a protective layer made of silicon oxide or the like be disposed on a surfaces of each of the metal layers containing silver. This structure allows for reducing discoloration of the metal layer containing silver due to sulfur components and the like in the atmosphere. The protective layers can be formed by a vacuum process such as sputtering, but other known methods may be employed alternatively.

The package 10 includes at least two electrodes (such as the first lead 51 and the second lead 52). The package 10 may include three or more electrodes. The package 10 may include, for example, a third lead in addition to the first lead 51 and the second lead 52. The third lead may function as a heat dissipating member or, similarly to the first lead 51 and the second lead 52, may function as an electrode.

The light-emitting device 100 may not include the package 10.

Second Embodiment

Figure 3:
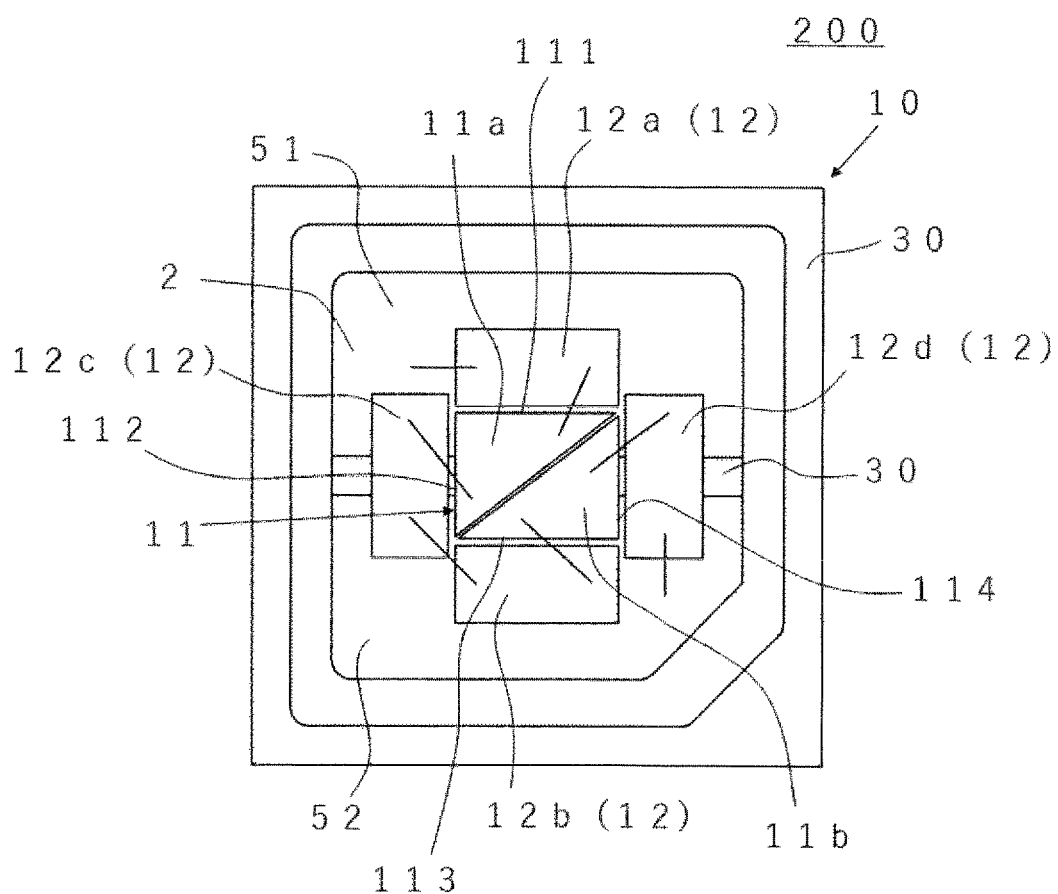
FIG. 3 is a schematic top view of a light-emitting device according to a second embodiment of the present disclosure.

FIG. 3 is a schematic top view of a light-emitting device 200 according to a second embodiment. In FIG. 3, illustrations of the first phosphor 7 and the sealing member 40 are omitted. The light-emitting device 200 differs from the light-emitting device 100 according to the first embodiment mainly in that a plurality of green light-emitting elements constitute the inner light-emitting element 11. The light-emitting device 200 includes inner light-emitting elements 11 each having an n-sided polygonal shape (n is an integer of 3 or more) in a plan view with a peak emission wavelength in the range of 490 nm to 570 nm, m (m is an integer of 3 or more) outer light-emitting elements 12 with a peak emission wavelength of 430 nm or greater and less than 490 nm, and the first phosphor 7 with a peak emission wavelength in the range of 580 nm to 680 nm.

The light-emitting device 200 includes a plurality of green light-emitting elements constituting the inner light-emitting elements 11. Each of the green light-emitting elements includes a light-emitting part. In the light-emitting device 200, the combination of the green light-emitting elements can form a virtual inner light-emitting element with an n-sided polygonal shape in a plan view. In the light-emitting device 200 shown in FIG. 3, the inner light-emitting elements 11 includes a first green light-emitting element 11a and a second green light-emitting element 11b each having a triangular planar shape. The first green light-emitting element 11a has the first lateral surface 111, the second lateral surface 112, and a lateral surface facing the second green light-emitting element 11b. The second green light-emitting element 11b has the third lateral surface 113, the fourth lateral surface 114, and a lateral surface facing the first green light-emitting element 11a. In other words, the inner light-emitting elements 11 shown in FIG. 3 forms a virtual inner light-emitting element with a quadrilateral shape in a plan view having the four outer lateral surfaces including the first lateral surface 111, the second lateral surface 112, the third lateral surface 113, and the fourth lateral surface 114. The light-emitting device 200 further includes, as the m outer light-emitting elements 12, four outer light-emitting elements, which include the first light-emitting element 12a, the second light-emitting element 12b, the third light-emitting element 12c, and the fourth light-emitting element 12d. In other words, in the light-emitting device 200 shown in FIG. 3, n=m=4. The first light-emitting element 12a faces the first lateral surface 111 of the first green light-emitting element 11a, the second light-emitting element 12b faces the third lateral surface 113 of the second green light-emitting element 11b, the third light-emitting element 12c faces the second lateral surface 112 of the first green light-emitting element 11a, and the fourth light-emitting element 12d faces the fourth lateral surface 114 of the second green light-emitting element 11b. With this structure, the color of light emitted from corresponding lateral surfaces of the inner light-emitting elements 11 can be effectively mixed with the color of light emitted from the outer light-emitting elements. In addition, with the inner light-emitting elements 11 constituted of a plurality of green light-emitting elements, for example, the chromaticity of light emitted from the light-emitting device 200 can be easily adjusted by adjusting the number of the green light-emitting elements.

Third Embodiment

Figure 4A:
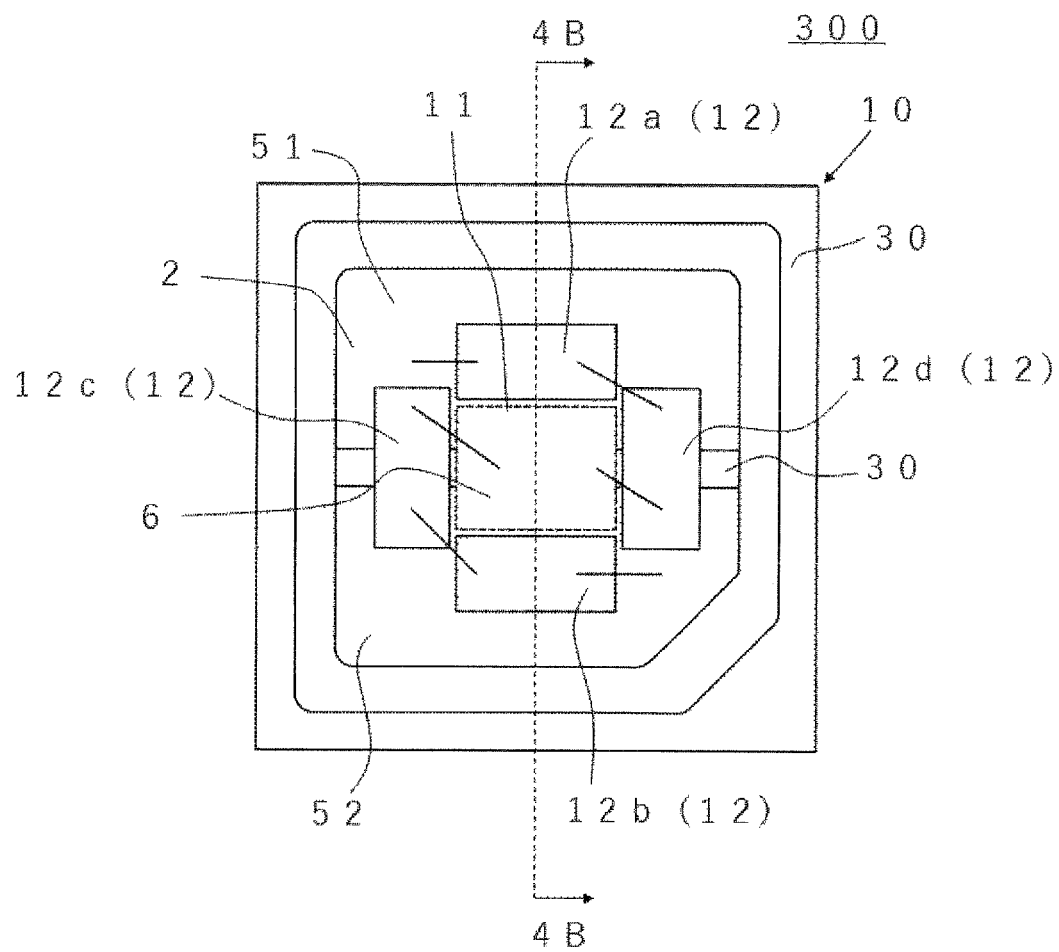
FIG. 4A is a schematic top view of a light-emitting device according to a third embodiment of the present disclosure.
Figure 4B:
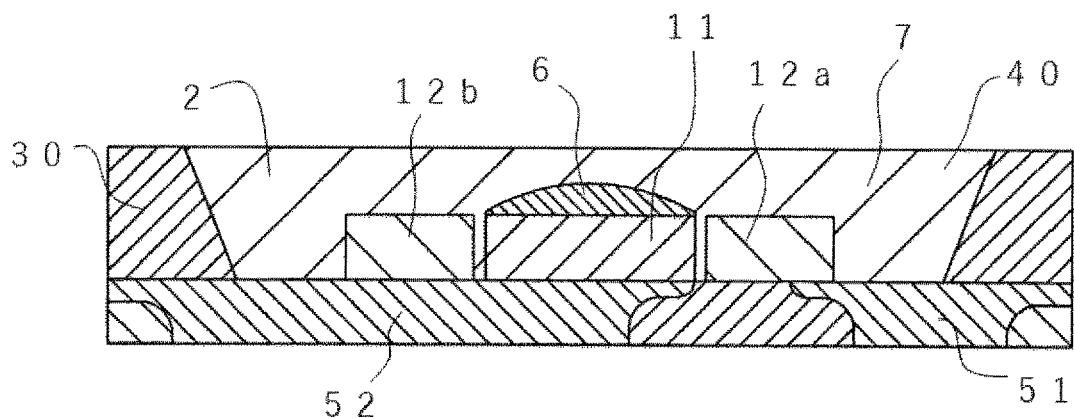
FIG. 4B is a schematic end view taken along the line 4B-4B of FIG. 4A.

FIG. 4A is a schematic top view of a light-emitting device 300 according to a third embodiment. FIG. 4B is a schematic end view taken along the line 4B-4B of FIG. 4A. In FIG. 4A, illustrations of the first phosphor 7 and the sealing member 40 are omitted. The light-emitting device 300 differs from the light-emitting device 100 according to the first embodiment mainly in that a covering member 6 is disposed on the upper surface of the inner light-emitting element 11.

The light-emitting device 300 includes the covering member 6 on the upper surface of the inner light-emitting element 11. In the light-emitting device 300 shown in FIG. 4A and FIG. 4B, the covering member 6 is located on the upper surface of the inner light-emitting element 11 but is not located on the upper surfaces of the m outer light-emitting elements 12. The covering member 6 is located between the sealing member 40 and the upper surface of the inner light-emitting element.

The covering member 6 is, for example, a resin member containing a second phosphor 8. It is preferable that the second phosphor 8 be a phosphor adapted to absorb green light emitted from the inner light-emitting element 11 and to emit light of another color. With this structure, the chromaticity of light emitted upward from the inner light-emitting element 11 can be easily adjusted by adjusting the content of the second phosphor 8. For example, in the case where a $K_2SiF_6:Mn^{4+}$ phosphor is used for the first phosphor 7, it is preferable that a $(Sr,Ca)AlSiN_3:Eu$ or $(Sr,Ca)LiAl_3N_4:Eu$ phosphor be used for the second phosphor 8. In the case where the $K_2SiF_6:Mn^{4+}$ phosphor is used for the first phosphor 7, the $K_2SiF_6:Mn^{4+}$ phosphor is excited by blue light emitted from the outer light-emitting elements but is hardly excited by green light emitted from the inner light-emitting element 11. Accordingly, the chromaticity (in particular, the x value) of light emitted upward from the outer light-emitting elements may greatly differ from the chromaticity (in particular, the x value) of light emitted upward from the inner light-emitting element 11. However, with the covering member 6 containing a $(Sr,Ca)AlSiN_3:Eu$ or $(Sr,Ca)LiAl_3N_4:Eu$ phosphor, which is adapted to be excited by green light, and disposed on the upper surface of the inner light-emitting element 11, the chromaticity (in particular, the x value) of light emitted upward from the inner light-emitting element 11 can be closer to the chromaticity (in particular, the x value) of light emitted upward from the outer light-emitting elements. Accordingly, unevenness in emission color of the light-emitting device 300 is effectively reduced.

In another embodiment, the covering member 6 is, for example, a resin member containing a light-reflective member such as titanium oxide. With the covering member 6 containing titanium oxide or the like and disposed on the upper surface of the inner light-emitting element 11, the proportion of light laterally emitted from the inner light-emitting element 11 increases. With this structure, the color of light emitted from the inner light-emitting element 11 can be effectively mixed with the color of light emitted from the outer light-emitting elements, each of which facing a corresponding one of the lateral surfaces of the inner light-emitting element 11.

The covering member 6 can contain both the second phosphor 8 and a light-reflective member such as titanium oxide.

Configurations of the light-emitting device described in each of the first to third embodiments and their variant examples are suitably applicable to other embodiments.

Figure 5A:
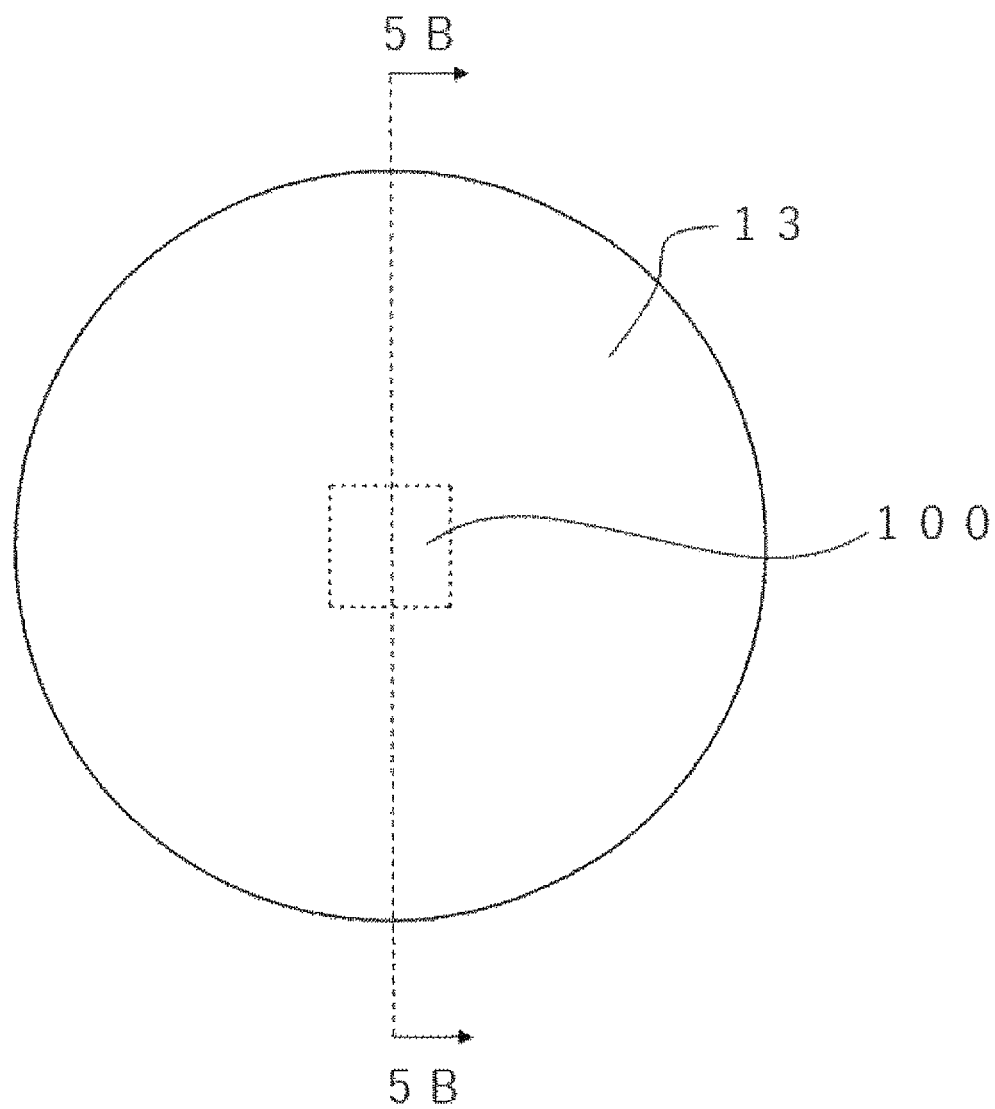
FIG. 5A is a schematic top view of a light-emitting device according to the present disclosure and a lens member.
Figure 5B:
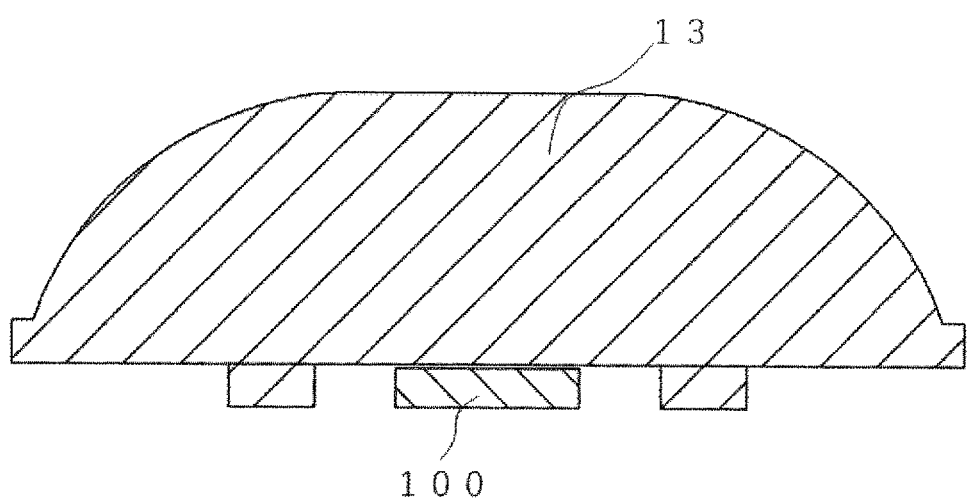
FIG. 5B is a schematic end view taken along the line 5B-5B of FIG. 5A.

The light-emitting device described in each of the first to third embodiments and their variant examples can be used for, for example, direct-type backlight sources for liquid-crystal display devices. In the case where the light-emitting device is used for a direct-type backlight source, it is preferable that a lens member 13 be disposed over the light-emitting device as shown in FIG. 5A and FIG. 5B. FIG. 5A is a schematic top view of the light-emitting device 100 and the lens member 13. FIG. 5B is a schematic end view taken along the line 5B-5B of FIG. 5A. In FIG. 5A and FIG. 5B, the lens member 13 is located over the light-emitting device 100, and the optical axis of the lens member 13 substantially coincides with the optical axis of the light-emitting device 100. For example, the lens member 13 can broaden the distribution of light emitted from the light-emitting device, and/or can improve the color mixing performance of light emitted from the light-emitting device. With this structure, unevenness in luminance and color of light emitted from the liquid-crystal display can be effectively reduced. The light-emitting device described in each of the first to third embodiments and their variant examples are not limited to be used for direct-type backlight sources. The light-emitting devices can be used for, for example, edge-type backlight sources.

What is claimed is:
1. A light-emitting device comprising:
   an inner light-emitting element having a rectangular shape in a plan view with a peak emission wavelength in a range of 490 nm to 570 nm;
   four outer light-emitting elements, each of the four outer light emitting elements being a light-emitting element with a peak emission wavelength of 430 nm or greater and less than 490 nm; and a first phosphor with a peak emission wavelength in a range of 580 nm to 680 nm covering the inner light-emitting element and the four outer light-emitting elements,
wherein the inner light-emitting element has a first lateral surface corresponding to a longitudinal side of the rectangular shape, a second lateral surface opposite to the first lateral surface, a third lateral surface connected to the first lateral surface and the second lateral surface, the third lateral surface corresponding to a transverse direction of the rectangular shape, and a fourth lateral surface opposite to the third lateral surface,
wherein the four outer light-emitting elements have a first light-emitting element having a first element lateral surface facing at least a portion of the first lateral surface, a second light-emitting element having a second element lateral surface facing at least a portion of the second lateral surface, a third light-emitting element having a third element lateral surface facing at least a portion of the third lateral surface, and a fourth light-emitting element having a fourth element lateral surface facing at least a portion of the fourth lateral surface,
wherein, in a plan view, the first light-emitting element, the second light-emitting element, the third light-emitting element, the fourth light-emitting element have a rectangular shape, respectively, and each of the first element lateral surface, the second element lateral surface, the third element lateral surface, and the fourth element lateral surface defines a longitudinal side of the rectangular shape,
wherein the first light-emitting element, the inner light-emitting element and the second light-emitting element are arranged in parallel with each other in a first direction,
wherein the third light-emitting element, the inner light-emitting element and the fourth light-emitting element are arranged in parallel with each other in a second direction vertical to the first direction, and
wherein the first light-emitting element is arranged to be spaced apart from the third light-emitting element and the fourth light-emitting element in the first direction.

2. The light-emitting device according to claim 1, wherein a width of the third element lateral surface is larger than a width of the third lateral surface in the first direction.

3. The light-emitting device according to claim 1, wherein a whole portion of the third lateral surface faces the third element lateral surface.

4. The light-emitting device according to claim 1, wherein a width of the fourth element lateral surface is larger than a width of the fourth lateral surface in the first direction.

5. The light-emitting device according to claim 1, wherein a whole portion of the fourth lateral surface faces the fourth element lateral surface.

6. The light-emitting device according to claim 1, wherein the third lateral surface and a portion of a lateral surface of the first light-emitting element are aligned with each other.

7. The light-emitting device according to claim 1, wherein the third lateral surface and a portion of a lateral surface of the second light-emitting element are aligned with each other.

8. The light-emitting device according to claim 1, further comprising a covering member on an upper surface of the inner light-emitting element.

9. The light-emitting device according to claim 1, wherein the inner light-emitting element and the four outer light-emitting elements are electrically connected in series.

10. The light-emitting device according to claim 1, further comprising a package having a recess,
wherein the inner light-emitting element and the four outer light-emitting elements are disposed on a bottom surface of the recess.

11. The light-emitting device according to claim 1, wherein a lateral surface of each of all the outer light-emitting elements, which faces the lateral surface of the inner light-emitting element, faces 50% or more of the lateral surface of the inner light-emitting element.

12. The light-emitting device according to claim 1, wherein a lateral surface of each of all the outer light-emitting elements, which faces the lateral surface of the inner light-emitting element, faces 75% or more of the lateral surface of the inner light-emitting element.

13. The light-emitting device according to claim 1, wherein a width of the third element lateral surface is larger than a width of the third lateral surface in the first direction, and
wherein a whole portion of the third lateral surface faces the third element lateral surface.

14. The light-emitting device according to claim 1, wherein a width of the fourth element lateral surface is larger than a width of the fourth lateral surface in the first direction, and
wherein a whole portion of the fourth lateral surface faces the fourth element lateral surface.

15. The light-emitting device according to claim 1, wherein a width of the third element lateral surface is larger than a width of the third lateral surface in the first direction, and
wherein a width of the fourth element lateral surface is larger than a width of the fourth lateral surface in the first direction.

16. The light-emitting device according to claim 1, wherein the third lateral surface and a portion of a lateral surface of the first light-emitting element are aligned with each other, and
wherein the third lateral surface and a portion of a lateral surface of the second light-emitting element are aligned with each other.

17. The light-emitting device according to claim 1, wherein a width of the third element lateral surface is larger than a width of the third lateral surface in the first direction,
wherein a whole portion of the third lateral surface faces the third element lateral surface, and
wherein a lateral surface of each of all the outer light-emitting elements, which faces the lateral surface of the inner light-emitting element, faces 50% or more of the lateral surface of the inner light-emitting element.

18. The light-emitting device according to claim 1, wherein a width of the third element lateral surface is larger than a width of the third lateral surface in the first direction,
wherein a whole portion of the third lateral surface faces the third element lateral surface, and
wherein a lateral surface of each of all the outer light-emitting elements, which faces the lateral surface of the inner light-emitting element, faces 75% or more of the lateral surface of the inner light-emitting element.

19. The light-emitting device according to claim 1, wherein a width of the third element lateral surface is larger than a width of the third lateral surface in the first direction,
wherein a whole portion of the third lateral surface faces the third element lateral surface,
wherein a width of the fourth element lateral surface is larger than a width of the fourth lateral surface in the first direction, and wherein a lateral surface of each of all the outer light-emitting elements, which faces the lateral surface of the inner light-emitting element, faces 50% or more of the lateral surface of the inner light-emitting element.

20. The light-emitting device according to claim 1, wherein a width of the third element lateral surface is larger than a width of the third lateral surface in the first direction,
wherein a whole portion of the third lateral surface faces the third element lateral surface,
wherein a width of the fourth element lateral surface is larger than a width of the fourth lateral surface in the first direction, and
wherein a lateral surface of each of all the outer light-emitting elements, which faces the lateral surface of the inner light-emitting element, faces 75% or more of the lateral surface of the inner light-emitting element.

* * * * *